United States Patent
Sato et al.

(10) Patent No.: US 7,084,470 B2
(45) Date of Patent: Aug. 1, 2006

(54) SPIN TUNNEL TRANSISTOR

(75) Inventors: Rie Sato, Kanagawa-ken (JP); Koichi Mizushima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 28 days.

(21) Appl. No.: 10/926,090

(22) Filed: Aug. 26, 2004

(65) Prior Publication Data

US 2005/0079665 A1    Apr. 14, 2005

(30) Foreign Application Priority Data

Sep. 24, 2003   (JP)   ............... 2003-332103

(51) Int. Cl.
*H01L 29/82*   (2006.01)
*H01L 43/00*   (2006.01)

(52) U.S. Cl. .............. 257/423; 257/421; 257/565

(58) Field of Classification Search ........ 257/421, 257/423, 565
See application file for complete search history.

(56) References Cited

U.S. PATENT DOCUMENTS

| | | |
|---|---|---|
| 5,747,859 A | 5/1998 | Mizushima et al. |
| 5,973,334 A | 10/1999 | Mizushima et al. |
| 6,919,608 B1 * | 7/2005 | Gregg ............... 257/423 |
| 2003/0164509 A1 * | 9/2003 | Gregg ............... 257/197 |

OTHER PUBLICATIONS

D.J. Monsma, et al., "Perpendicular Hot Electron Spin-Valve Effect in a New Magnetic Field Sensor: The Spin-Valve Transistor" Physical Review Letters, vol. 74, No. 26, Jun. 26, 1995, pp. 5260-5623.

D.J. Monsma, et al., "Room Temperature-Operating Spin-Valve Transistors Formed by Vacuum Bonding", SCIENCE, vol. 281, Jul. 17, 1998, pp. 407-409.

* cited by examiner

*Primary Examiner*—Ngân V. Ngô
(74) *Attorney, Agent, or Firm*—Oblon, Spivak, McClelland, Maier & Neustadt, P.C.

(57) ABSTRACT

Some spin tunnel transistors with a larger current transmittance and a higher MR ratio are described.

One of the spin tunnel transistor comprises a collector; an emitter; a base formed between the collector and the emitter, including a first ferromagnetic metal layer variable in its magnetization under an external magnetic field; a barrier layer formed between the first ferromagnetic metal layer and one of the collector and the emitter, the other of the collector and the emitter including a semiconductor crystal layer; and a transition metal silicide crystal layer between the semiconductor crystal layer and the base. The transition metal silicide crystal layer may be replaced with a palladium layer, a transition metal nitride layer, or a transition metal carbide layer.

6 Claims, 2 Drawing Sheets

SPIN TUNNEL TRANSISTOR

BACKGROUND OF THE INVENTION

1. Field of the Invention

The present invention relates to a spin tunnel transistor used for a high-density magnetic recording and reading magnetic head, etc.

2. Description of the Related Art

The recording density in the magnetic recording has been increased at an annual rate of 100 percent since the debut of GMR heads in which the giant magneto resistive effect (GMR effect) is utilized. A GMR device includes a stacked film having the sandwich structure, Ferromagnetic metal layer/Non-magnetic metal layer/Ferromagnetic metal layer. Taking an example of such device, there is as pin-valve type magnetoresistive device, in which the magnetization of one of the ferromagnetic metal layers is fixed and the magnetization of the other ferromagnetic metal layer is changed according to an external magnetic field. The spin-valve type magnetoresistive device can detect a resistance value incorporating a change in the cosine of the relative angle of magnetization between the ferromagnetic metal layers.

Further, the development of a TMR device, in which the tunnel magnetoresistive effect (TMR effect) is utilized, is pursued in order to cope with higher density magnetic recording. A TMR device includes a stacked film of Ferromagnetic metal layer/Non-magnetic insulator/Ferromagnetic metal layer. In the TMR device, a voltage is applied between the ferromagnetic metal layers to detect the change in a relative angle of the magnetization between the two ferromagnetic metal layers as a change in tunnel resistance value.

In cotrast, the development of three-terminal devices, referred to as spin tunnel transistors, is pursued. The device structures thereof include structure of: SMS (Semiconductor/Metal/Semiconductor) type; MIMS (Metal/Insulator/Metal/Semiconductor) type; and MIMIM (Metal/Insulator/Metal/Insulator/Metal) type. However, any of devices having the above structures are double-junction, three-terminal devices. In each of the double-junction, three-terminal devices, a base sandwiched between its emitter and collector is made of a metal (i.e. magnetic stacked film) (see U.S. Pat. No. 5,747,859 for MIMS structure).

The above-described spin tunnel transistor exhibits an extremely large change of magnetoresistance (MR) of several hundreds percentage, while the collector current is as remarkably small as $10^{-4}$ times the emitter current and therefore a ratio of collector current to emitter current (i.e. current transmittance) cannot increase. A remarkably small current transmittance is not suitable from the viewpoints of electric power consumption, working speeds, noises, etc.

SUMMARY OF THE INVENTION

The present invention provides a spin tunnel transistor comprising: a collector; an emitter; a base formed between the collector and the emitter, including a first ferromagnetic metal layer variable in its magnetization under an external magnetic field; a barrier layer formed between the base and one of the collector and the emitter, the other of the collector and the emitter including a semiconductor crystal layer; and a transition metal silicide crystal layer between the semiconductor crystal layer and the base. The transition metal silicide crystal layer may be replaced with a palladium layer, a transition metal nitride layer, or a transition metal carbide layer.

In regard to a spin tunnel transistor with a magnetic stacked film used for its base section, in a base-collector interface is interposed a thin transition metal silicide crystal layer, a transition metal nitride layer, a transition metal carbide layer or a Pd layer, whereby a spin tunnel transistor with a large MR ratio and a large current transmittance can be achieved.

Each of these spin tunnel transistors may be formed/used as a magnetic reproducing sensor or sensing element of a magnetic reproducing head. Also, each of these spin tunnel transistors may be formed/used as a memory element of integrated memory circuit, such as a magnetic random access memory.

DESCRIPTION OF THE PREFERRED EMBODIMENTS

Figure 1:
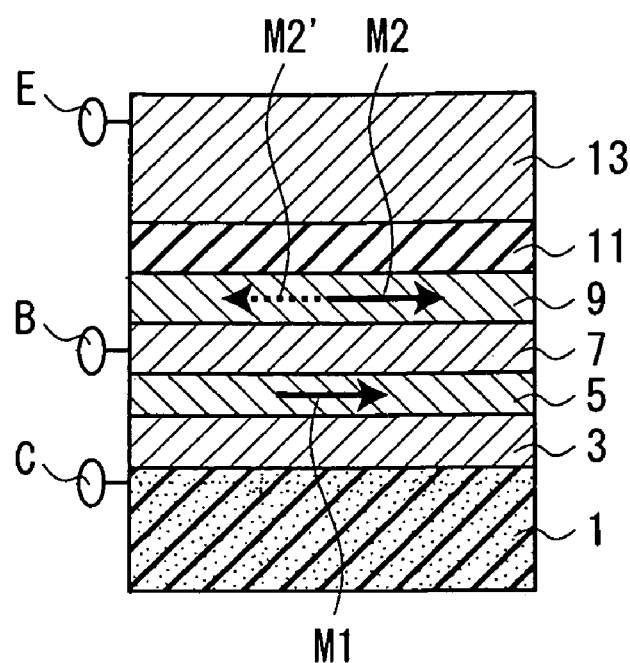
FIG. 1 is a cross-sectional diagrammatic illustration of assistance in explaining a spin tunnel transistor according to the first embodiment of the invention.

The embodiments of the invention will be described in reference to the drawings below.

Constituent features common throughout the embodiments and examples are identified by the same reference character and the redundancy of the description thereof is omitted. Each of the drawings is a diagrammatic illustration for facilitating the description and understanding of the invention. Some of shapes, dimensions, ratios, etc. illustrated in the drawings differ from corresponding ones in the actual device, but these may be changed in design appropriately in consideration of the following description and the known art.

Embodiment 1

A spin tunnel transistor in connection with the first embodiment of the invention will be described in reference to the cross-sectional diagrammatic illustration of FIG. 1.

The spin tunnel transistor according to the first embodiment has a ferromagnetic metal layer 5, a non-magnetic metal layer 7, a ferromagnetic metal layer 9, a barrier layer 11, and a non-magnetic metal layer 13, which are stacked on a crystalline semiconductor layer (or substrate) 1 of silicon, etc. through an interface layer 3 formed on the semiconductor layer by epitaxial growth in order.

Here, the semiconductor layer 1 constitutes a collector of the spin tunnel transistor; the ferromagnetic metal layer 5, non-ferromagnetic metal layer 7 and ferromagnetic metal layer 9 constitute a base; and the non-magnetic metal layer 13 constitutes an emitter. In addition, the barrier layer 11 of a dielectric material is formed between the base and emitter, and a tunnel barrier is formed between the ferromagnetic metal layer 9 and the non-magnetic metal layer 13. Therefore, the spin tunnel transistor has a MIMS structure.

The ferromagnetic metal layer 5 of the base is a fixedly-magnetized layer with a fixed magnetization M1. The ferromagnetic metal layer 9 is a free-magnetized layer with its magnetization M2 variable according to application of an external magnetic field H (other than zero magnetic field).

More specifically, the application of an external magnetic field H to the base in the direction from the left to the right in the sheet of FIG. 1 turns the ferromagnetic metal layer 9 into the magnetization M2 in parallel with the magnetization M1; the application of an external magnetic field H' to the base in the direction from the right to the left in the sheet of FIG. 1 turns the ferromagnetic metal layer 9 into the magnetization M2' in antiparallel with the magnetization M1. As for the fixedly-magnetized layer, the magnetization thereof may be moved somewhat when an external magnetic field H is applied. However, the change is small with respect to the movement of the magnetization of the free-magnetized layer and is on the level where the change cannot affect the change of MR of the spin tunnel transistor.

The amount of a current passing through the stacked film of the base is proportional to the cosine of a relative angle between the magnetizations M1 and M2. Therefore, the base resistance becomes minimum under the external magnetic field H and it becomes maximum under the external magnetic field H' (Magnetoresistive Effect). The change of MR depending on an external magnetic field can be sensed by measuring a current flowing through the spin tunnel transistor and a corresponding voltage value.

Incidentally, as for a so-called spin-valve type device, the ferromagnetic metal layer 9 is so set that its magnetization forms an angle of 90 degrees with respect to the fixed magnetization of the ferromagnetic metal layer 5 (or is turned to a direction perpendicular to a surface of the sheet of FIG. 1) in the condition where a zero magnetic field is applied. Further, in regard to a base of an antiferromagnetic coupled GMR device, the ferromagnetic metal layers 5, 9 are antiferromagnetically coupled with each other in the condition where a zero magnetic field is applied (when the magnetoresistance is made maximum); under the influence of a given magnetic field, the antiferromagnetic coupling is cut and thus the magnetization is aligned in the same direction as that of the applied magnetic field (and the magnetoresistance is made minimum).

The change of MR is measured by determining a collector current. On this account, the collector is connected to an external circuit through an electrode (i.e. a collector terminal C) formed on, for example, a side surface of the semiconductor layer 1 or the rear surface opposite to the surface adjacent to the interface layer 3.

Further, in a spin tunnel transistor, the emitter and the base are also connected to an external circuit for the purpose of applying a voltage between the emitter and the base to inject electrons (i.e. hot electrons HE). More specifically, the base is connected to the external circuit through a base terminal B in its end portion; the emitter is connected to the external circuit through an emitter terminal E of the non-magnetic metal layer 13 or of other metal electrode layer or the like, which are connected to the non-magnetic metal layer 13.

Figure 2:
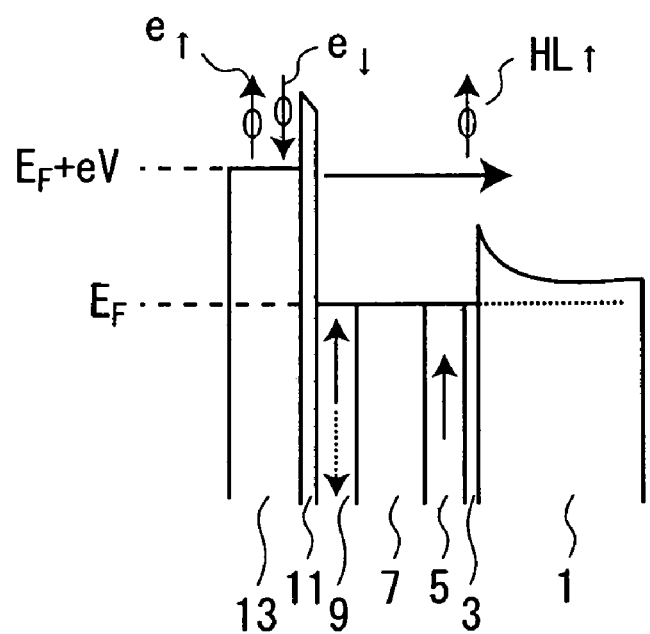
FIG. 2 is an energy diagram of the spin tunnel transistor according to the first embodiment.

FIG. 2 is an energy diagram of the spin tunnel transistor shown in FIG. 1.

An emitter voltage is applied between the emitter and the base to inject hot electrons HE into the base from the emitter. The electrons (hot electrons HE) injected into the base from the emitter are scattered according to the respective spins in the base. Then some of the injected hot electrons HE (HE↑ in FIG. 2) pass across the Schottky barrier between the interface layer 3 and the semiconductor layer 1 and reach the collector.

The magnetoresistive effect ratio (MR ratio) of the spin tunnel transistor is a result of the non-equivalence of conductivities between electrons each having a spin magnetic moment in parallel with the magnetizations of the ferromagnetic metal layers 5, 9 (e.g. up-spin electrons HE↑) and electrons each having a spin magnetic moment in antiparallel with the magnetizations (e.g. down-spin electrons HE↓) in the magnetic stacked film of the base. The collector current produced by the hot electrons, which have passed over the Schottky barrier and reached the collector, flows out from the device through the terminal and then to be sensed.

Here, the main reason of a small current transmittance of the spin tunnel transistor seems to be that the hot electrons are subjected to strong reflections in the interface between the metal base and the semiconductor collector. The reflections are classified into the reflection caused by an interface barrier formed at the time of creating the Metal/Semiconductor layer interface and the quantum mechanical reflection caused by the difference in electron wavelength between the semiconductor layer and the metal layer. For the reflections, it has been found out that the reflection caused by the interface barrier is especially larger than the other and strongly depends on the material in the interface between the metal layer and the semiconductor layer.

First, the current transmittances for the base and the collector of a spin transistor can be expressed as the expression (1) approximately.

[Number 1] (1)

$$\frac{I_C}{I_E} = T_{M \to S} \times \sum \left[ T_{M \to M} \times \exp\left(-\frac{D}{\lambda}\right) \right]$$

In the expression, $I_C$ is a collector current value; $I_E$ represents an emitter current value; $T_{M \to S}$ is a current transmittance in a Metal layer/Semiconductor layer interface; $T_{M \to M}$ is a transmittance in a Metal layer/Metal layer interface in the magnetic stacked film (base); D is a thickness of the magnetic stacked film; and $\lambda$ is a spin attenuation length of an electron in the metal. As seen from the expression, use of a material which may provide a high transmittance in the interface and a long spin attenuation length and contriving a film thickness of the base are necessary in order to increase the current transmittance.

As described later, the inventors used Al (aluminum) for the non-magnetic metal layer 13 and $Al_2O_3$ (aluminum oxide) for the barrier layer 11 to prepare hot electron spin tunnel transistors having bases of various materials and various thicknesses and investigated the transistors about the current transmittance in a Metal/Semiconductor layer interface, the current transmittance in a Metal layer/Metal layer interface, and a current attenuation factor in a metal based on their current/voltage characteristics.

The table 1 shows the results of the measurements on the current transmittances in Metal layer/Semiconductor layer interfaces.

TABLE 1

| | Emitter Voltage (V) | Transmittance ($T_{M \to S}$) |
|---|---|---|
| Si (111)/CoSi$_2$ | 1.5 | 0.15 |
| | 2 | 0.2 |
| | 3 | 0.35 |
| Si (100)/PtSi | 0.9 | 0.1 |
| Si (111)/Pd | 1.5 | 0.06 |
| Si (100)/Pd | 1.5 | 0.06 |
| | 2 | 0.1 |
| Si (100)/TiN | 1.5 | 0.08 |
| | 2 | 0.14 |
| Si (100)/TiC | 1.5 | 0.07 |

TABLE 1-continued

| | Emitter Voltage (V) | Transmittance ($T_{M \to S}$) |
|---|---|---|
| Si (100)/FeN | 1.5 | 0.07 |
| Si (111)/Au | 1.5 | 0.045 |
| GaAs/Co$_{87}$Fe$_{16}$ | 1.5 | 0.001 |
| | 2 | 0.003 |
| GaAs/Ni$_{81}$Fe$_{19}$ | 1.5 | 0.0001 |
| | 2 | 0.0003 |

In spite of current transmittances depending on emitter voltages V, the highest transmittance was obtained for the interface between a crystalline metal silicide epitaxially grown on a single crystal of Si (silicon) and the single crystal Si, which was about 10% or more. Second, the transmittances were higher in the case where an interface with the single crystal Si was formed with transition metal nitride and transition metal carbide. In the interfaces between single crystal Si and transition metal nitride and transition metal carbide, the diffusion of electrons seems to be reduced somewhat thereby to increase the current transmittance because Si atoms are less prone to being diffused and sharp profile interfaces tend to be formed there.

Table 2 shows the results of the measurements on current transmittances in Metal layer/Metal layer interfaces.

TABLE 2

| | Emitter Voltage (V) | Transmittance ($T_{M \to M}$) |
|---|---|---|
| Co/Cu/Co | 1.5 | 0.43 |
| Co$_{84}$Fe$_{16}$/Cu | 1–2 | 1 |
| Ni$_{81}$Fe$_{19}$/Cu | 1–2 | 1 |
| Co$_{84}$Fe$_{16}$/Au | 1–2 | 0.1 |
| Ni$_{81}$Fe$_{19}$/Au | 1–2 | 0.1 |
| Pt/Ni$_{80}$Fe$_{20}$/Au | 0.9 | 0.45 |

As known from Table 2, transmittances in Metal layer/Metal layer interfaces are as high as 10% or more in general.

Table 3 shows the results of the measurements on electron spin attenuation lengths in non-magnetic metals. The unit of spin attenuation lengths λ in the table is angstrom.

TABLE 3

| | Emitter Voltage (V) | λ (Angstrom) |
|---|---|---|
| CoSi$_2$ | 1.5 | 52 |
| | 2 | 48 |
| | 3 | 35 |
| PtSi | 0.9 | 14 |
| TiN | 1.5 | 50 |
| | 2 | 46 |
| FeN | 1.5 | 48 |
| Pd | 1.5 | 31 |
| | 2 | 26 |
| Au | 1.2 | 230 |
| Cu | 1.2 | 200 |
| Pt | 0.9 | 39 |

In regard to spin attenuation lengths in non-magnetic metals, it is found out that the attenuation lengths are longer in the noble metals, such as Au (gold) and Cu (copper), and the attenuation lengths are shorter in a silicide, a transition metal nitride, a transition metal carbide, Pd (palladium) and Pt (platinum), as seen from Table 3.

Table 4 shows the results of the measurements on spin attenuation lengths in the ferromagnetic metals.

TABLE 4

| | Emitter Voltage (V) | λ↑ (Angstrom) | λ↓ (Angstrom) |
|---|---|---|---|
| Co | 1.5 | 21 | 8.3 |
| Co$_{84}$Fe$_{16}$ | 1.5 | 50 | 8 |
| | 2 | 43 | 8 |
| Ni$_{81}$Fe$_{19}$ | 1.5 | 63 | 13 |
| | 2 | 50 | 13 |
| Ni$_{80}$Fe$_{20}$ | 0.9 | 43 | 10 |

As shown in Table 4, spin attenuation lengths λ in the ferromagnetic metals depend on a spin direction. The spin attenuation lengths of up-spin electrons (λ↑) are about 50 angstroms, whereas the attenuation lengths of down-spin electrons (λ↓) are as short as about 10 angstroms (1 nm).

What can be understood from the foregoing are as follows.

(1) The current transmittance in a Metal layer/Semiconductor layer interface is remarkably low in comparison with the transmittance in a Metal layer/Metal layer interface.

(2) In a cobalt silicide (Co silicide), a nickel silicide (Ni silicide), a transition metal carbide, a transition metal nitride, a metal layer such as a palladium (Pd) layer, which can provide high spin transmittances in the interfaces between them and Si, spin attenuation lengths are short.

(3) In order to obtain a high MR ratio, it is necessary for the ferromagnetic substance to have an average film thickness of about 1 nm or more.

Therefore, what is extremely effective for the purpose of increasing the current transmittance proved to be that any one of: a thin silicide layer of Co silicide, Ni silicide or the like; a thin transition metal carbide layer; a transition metal nitride layer; and a Pd layer, each exhibiting a high transmittance in its interface with Si, is interposed in the interface between the base metal and the semiconductor.

However, it is preferable that each of these thin films has a film thickness of about 1 nm or less because spin attenuation lengths λ are shorter and current attenuation factors are larger in these thin films. Incidentally, the average film thickness herein is an average value obtained by, for example, measuring film thicknesses for cross sections at ten points on a target film; the about 1 nm means that it includes a production error of a 1 nm-thick film.

It is desirable that the transition metal silicide layer is a crystal layer, and more preferably an epitaxial layer on a single crystal semiconductor. This is because an amorphous transition metal silicide layer cannot provide a large current transmittance as cited in a comparative example later.

In addition, a Pd layer is superior to an Au layer in improving the current transmittance. Further, use of a transition metal nitride layer or a transition metal carbide layer can suppress the formation of amorphous silicide in the interface, and therefore the current transmittance can be improved.

The interface between a metal and a semiconductor, where the interface layer 3 is to be used, may be either the interface between a metal base and a semiconductor emitter or the interface between the metal base and a semiconductor collector. In the case where the interface layer 3 is used between the base and the semiconductor emitter, a barrier layer for generating hot electrons may be formed in the interface between the base and the metal collector.

The following materials may be used as the materials for the layers of the spin tunnel transistor.

For the semiconductor layer 1, it is possible to use Si (silicon), SiGe, Ge (germanium), a semiconductor compound including any of these substances, or the like. In addition, the film thickness of the semiconductor layer 1 is not less than about 300 μm nor more than about 500 μm.

For the ferromagnetic metal layers 5, 9 in the base, it is possible to use Ni, Fe, Co, a ferromagnetic alloy including any of these substances, or the like. The ferromagnetic metal layer 5 as a fixedly-magnetized layer must have a magnetization which is never moved even in an external magnetization. As a means to do so, a material with a large coercive force may be used for the fixedly-magnetized layer. In the case where a ferromagnetic material having a small coercive force is used, a bias film for fixing its magnetization is required. For example, a hard magnetic film can be used as the bias film to fix the magnetization of the fixedly-magnetized layer through its leaking magnetic field. Also, an antiferromagnetic layer can be used instead of the hard magnetic layer to fix the magnetization of the fixedly-magnetized layer through the exchange magnetic coupling between the fixedly-magnetized layer and the antiferromagnetic layer. For the ferromagnetic metal layer 9 as a free-magnetized layer, it is required to use a material having a small coercive force thereby to enable the rotation of the magnetization by an external magnetic field.

While the average thicknesses of the ferromagnetic metal layers 5, 9 are not less than about 0.3 nm nor more than about 0.5 nm, the average thicknesses are more preferably not more than about 1 nm in order to keep the spin information of hot electrons and the crystallinity of the metal layers in good conditions.

For the non-magnetic metal layer 7 in the base, it is possible to use Cu, Au, Al (aluminum), an alloy including any of these substances and exhibiting the properties of a non-magnetic metal, or the like.

While the average thickness of non-magnetic metal layer 7 is not less than about 3 nm nor more than about 30 nm, the average thickness is more preferably not less than about 5 nm nor more than about 20 nm in order to obtain a high MR ratio.

For the non-magnetic metal layer 13 of the emitter, it is possible to use Cu, Al, Au, Ti (titanium), Ta (tantalum), W (tungsten), Mo (molybdenum), Pt, an alloy including any of these substances and exhibiting the properties of a non-magnetic metal, a stacked film of them, or the like. The thickness of the non-magnetic metal layer 13 of the emitter may be not less than about 10 nm nor more than about 200 nm.

As described above, the current transmittance of the spin tunnel transistor can be increased by interposing one of a thin silicide layer of Co silicide, Ni silicide or the like, a thin transition metal carbide layer, a transition metal nitride layer, or a Pd layer, which have high transmittances, in the interface between the semiconductor layer and the metal.

Embodiment 2

Figure 3:
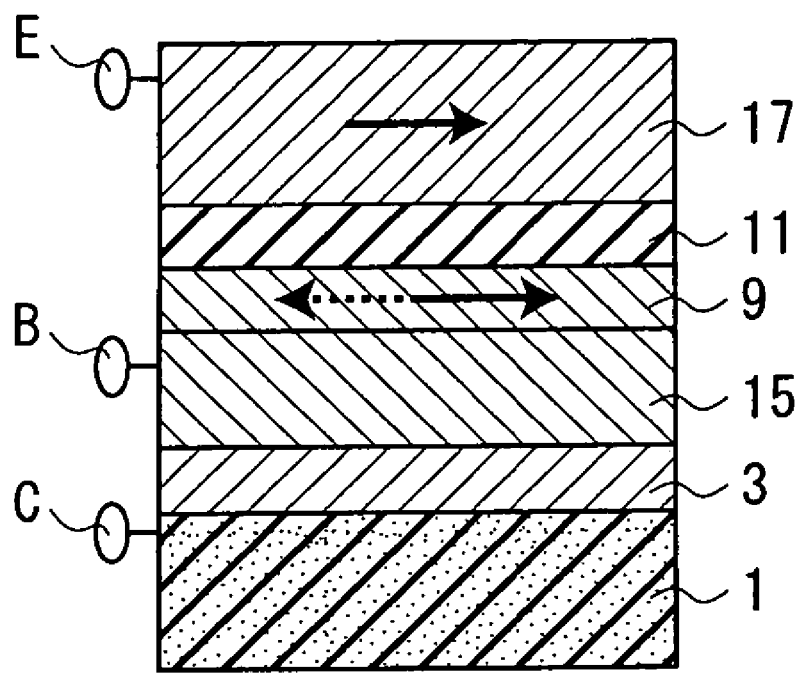
FIG. 3 is a cross-sectional diagrammatic illustration of assistance in explaining a spin tunnel transistor according to the second embodiment of the invention.

FIG. 3 is a cross-sectional diagrammatic illustration for the explanation of a spin tunnel transistor in connection with the second embodiment of the invention.

The spin tunnel transistor of the embodiment has a base including a non-magnetic metal layer of Cu or the like and a ferromagnetic metal layer 9 as a free-magnetized layer, and an emitter including a ferromagnetic metal layer 17 with its magnetization fixed. There is formed a ferromagnetic tunnel junction through a barrier layer 11 between the ferromagnetic metal layer 17 of the emitter and the base.

In this embodiment, the total film thickness of the base can be made thinner in comparison with that in the first embodiment, and the number of interfaces between metal layers in the base can be reduced. This embodiment is more advantageous in order to increase the current transmittance, whereas the embodiment has also a disadvantage such that the MR ratio doesn't increase (it is about 100%) because of spin inversion phenomena caused when electrons penetrate the tunnel junction, and the like.

Now, the examples of the invention will be described.

EXAMPLE 1

Example 1 relates to the spin tunnel transistor in the first embodiment.

Initially, the materials for the spin tunnel transistor in the example 1 and the preparing method thereof will be described.

In the first process, a $CoSi_2$ layer 3 of about 1 nm thickness was formed on a Si substrate 1, and then a base composed of a $Co_{84}Fe_{16}$ layer 5, a Cu layer 7 and a $Co_{84}Fe_{16}$ layer 9 was formed thereon. A multi-chamber MBE (Molecular Beam Epitaxy) apparatus was used for film formation, and the process was conducted under a pressure of $2\times10^{-10}$ torr.

First, in the first chamber of the MBE apparatus, a $n^+$-Si wafer was heated on the side of its (111) substrate surface for about two hours at about 500° C., and subsequently heated for about 0.5 hour at about 700° C. thereby to remove gases adsorbed by the surface.

Continuously, the wafer was heated to about 840° C. in an atmosphere of diluted Si flux thereby to remove a surface oxide film. At this point of time, the 7×7 structure on the surface of the Si substrate was checked by RHEED (Reflection High Energy Electron Diffraction).

A non-doped Si layer with a thickness of about 1 μm was formed as a buffer layer on the surface of the Si substrate 1 at about 700° C. After that, stoichiometric amounts of Co and Si were deposited concurrently and the wafer was annealed for about 10 minutes at about 600° C. thereby to form a $CoSi_2$ layer 3 with a thickness of about 1 nm.

The formation of the $Co_{84}Fe_{16}$ layer 5 (about 2 nm thickness), the Cu layer 7 (about 5 nm thickness) and the $Co_{84}Fe_{16}$ layer 9 (about 2 nm thickness) of the base was carried out in a second chamber by ion beam sputtering. Moreover, the formation of the $Co_{84}Fe_{16}$ layers was conducted during the application of a magnetic field of about 1000 Oe in order to impart uniaxial anisotropy to the two ferromagnetic metal layers 5, 9.

Subsequently, an $Al_2O_3$ tunnel barrier layer 11 (about 1.5 nm thickness) was formed using an Al source under an $O_2$ partial pressure of about $10^{-5}$ torr in a third chamber.

Then, a $CaF_2$ interlayer dielectric film of about 200 nm thickness was formed and the resultant dielectric film was subjected to photolithography and etching thereby to make the tunnel junction area between the base and the emitter 50×50 μm², followed by forming a stacked emitter (electrode) composed of an Al layer (about 10 nm thickness) and an Au layer (about 100 nm thickness).

Volt-ampere characteristics of the spin tunnel transistor were measured to determine the current transmittances and MR ratios, while a magnetic field was applied to the transistor in a plane thereof (in the left and right directions in the sheet of FIG. 1).

Consequently, the current transmittance and MR ratio at an emitter voltage of about 1.5 V were respectively about $5.0\times10^{-2}$ and about 314%. In addition, the current transmittance and MR ratio at an emitter voltage of about 2 V were $5.9\times10^{-2}$ and about 289% respectively.

COMPARATIVE EXAMPLE 1

For comparison with the example 1, an amorphous $CoSi_2$ layer (about 1 nm thickness) was formed on a Si substrate to prepare a spin tunnel transistor having the same structure as that of the example 1 except for the amorphous layer, followed by conducting the measurements of the current transmittances and MR ratios. In the amorphous $CoSi_2$ layer formation, Co and Si were concurrently deposited as in the case of the example 1, and then the resultant layer was left as an amorphous layer without being annealed. The spin tunnel transistor exhibited a current transmittance of $1 \times 10^{-4}$ and a MR ratio of about 300% with an emitter voltage of 1.5 V. The MR ratio was comparable to that of the spin tunnel transistor in which a crystal $CoSi_2$ was used, whereas the current transmittance was remarkably reduced.

COMPARATIVE EXAMPLE 2

Using the same process as that in the example 1, a spin tunnel transistor was formed on a Si substrate through a 1 nm-thick Au layer, which had a $Co_{84}Fe_{16}$ layer (about 2 nm thickness), a Cu layer (about 5 nm thickness) and a $Co_{84}Fe_{16}$ layer (about 2 nm thickness) of the base, an $Al_2O_3$ barrier layer, and an Al emitter layer.

In regard to the transistor, the current transmittance and MR ratio at an emitter voltage of about 1.5 V were about $2.8 \times 10^{-3}$ and about 99% respectively. The transistor exhibited a current transmittance one or more orders of magnitude lower than that the transistor of the example 1 did.

EXAMPLE 2

Example 2 relates to the spin tunnel transistor in the first embodiment.

A spin tunnel transistor, which had a base composed of a $Co_{84}Fe_{16}$ layer 5 (about 2 nm thickness), a Cu layer 7 (about 5 nm thickness) and a $Co_{84}Fe_{16}$ layer 9 (about 2 nm thickness) as in the case of the example 1, was formed on a Si substrate 1 through a TiN layer 3 of about 1 nm thickness. The TiN layer 3 was made by ion beam sputtering. The formation of the other layers was conducted in the same process as that in the example 1.

In regard to the spin tunnel transistor, the current transmittance and MR ratio at an emitter voltage of 1.5 V were about $2.5 \times 10^{-2}$ and about 280% respectively.

A similar device including a TiC or FeN layer instead of the TiN layer was prepared. In the case of the transistor with a TiC layer, the current transmittance and MR ratio at an emitter voltage of about 1.5 V were about $2.1 \times 10^{-2}$ and about 260% respectively. With the device with a FeN layer, when the emitter voltage of the transistor was about 1.5 V, the current transmittance and MR ratio were about $1.3 \times 10^{-2}$ and about 290% respectively.

EXAMPLE 3

Example 3 relates to the spin tunnel transistor in the second embodiment.

Using the same process as that in the example 1, a spin tunnel transistor was formed on a Si substrate 1 through a $CoSi_2$ layer 3 of about 1 nm thickness, which included a Cu layer 15 (about 5 nm thickness), a $Ni_{81}Fe_{19}$ layer 9 (about 4 nm thickness), an $Al_2O_3$ layer 11, and a Fe layer 17 (about 10 nm thickness). On the Fe layer 17 was formed an Au electrode of about 100 nm thickness.

In the transistor, the current transmittance and MR ratio at an emitter voltage of about 1.5 V were about $4.1 \times 10^{-2}$ and about 101% respectively, and the current transmittance and MR ratio at an emitter voltage of about 2 V were about $5.5 \times 10^{-2}$ and about 96.6% respectively.

COMPARATIVE EXAMPLE 3

A spin tunnel transistor including an Au layer of about 1 nm thickness instead of the $CoSi_2$ layer of about 1 nm thickness in the example 3 was prepared using the same process as that in the example 2. In the transistor, the current transmittance and MR ratio at an emitter voltage of about 1.5 V were about $3.9 \times 10^{-3}$ and about 93% respectively. The transistor exhibited a current transmittance one or more orders of magnitude lower than that the transistor of the example 2 did.

EXAMPLE 4

Example 4 relates to the spin tunnel transistor in the second embodiment.

Using the same process as that in the example 2, a spin tunnel transistor was formed on a Si substrate 1 through a Pd layer 3 of about 1 nm thickness, which had a Cu layer 15 (about 5 nm thickness) and a $Ni_{81}Fe_{19}$ layer 9 (about 4 nm thickness) of the base, an $Al_2O_3$ barrier layer 11, and a $Co_{84}Fe_{16}$ layer 17 (about 10 nm thickness). On the $Co_{84}Fe_{16}$ layer 17 was formed an Au electrode of about 100 nm thickness.

In the transistor, the current transmittance and MR ratio at an emitter voltage of about 1.5 V were about $3.2 \times 10^{-2}$ and about 62% respectively, and the current transmittance and MR ratio at an emitter voltage of about 2 V were about $4.4 \times 10^{-2}$ and about 60.4% respectively.

While the embodiments of the invention have been described above, the invention is not so limited and various changes may be made within the scope of the subject matter of the invention as defined in the claims.

Also, in practicing the invention, various modifications may be made without departing from the subject matter of the invention.

Further, variations are possible by appropriate combinations of constituent elements disclosed in the above embodiments. For example, some of the all constituent elements shown in the embodiments may be deleted. Also, the constituent elements may be appropriately combined across the different embodiments.

What is claimed is:

1. A spin tunnel transistor comprising:
    a collector;
    an emitter;
    a base formed between the collector and the emitter, the base comprising a first ferromagnetic metal layer variable in its magnetization under an external magnetic field;
    a barrier layer formed between the base and one of the collector and the emitter, the other of the collector and the emitter comprising a semiconductor crystal layer; and
    a transition metal silicide crystal layer between the semiconductor crystal layer and the base.

2. The spin tunnel transistor of claim 1, wherein the base further comprises:
- a non-magnetic metal layer on the first ferromagnetic metal layer; and
- a second ferromagnetic metal layer stacked via the first non-magnetic metal on the first ferromagnetic metal layer, the second ferromagnetic metal layer having a magnetization substantially fixed under the external magnetic field.

3. The spin tunnel transistor of claim 1, wherein the barrier layer is formed between the base and the collector, the collector comprises a second ferromagnetic metal layer, the second ferromagnetic metal layer has a magnetization substantially fixed under the external magnetic field.

4. The spin tunnel transistor of claim 1, wherein the barrier layer is formed between the base and the emitter, the emitter comprises a second ferromagnetic metal layer, the second ferromagnetic metal layer has a magnetization substantially fixed under the external magnetic field.

5. A magnetic random access memory, comprising the spin tunnel transistor of claim 1.

6. A magnetic reproducing head, comprising the spin tunnel transistor of claim 1.

* * * * *